United States Patent
Jhang Jian

(10) Patent No.: US 12,309,018 B2
(45) Date of Patent: May 20, 2025

(54) RADIO FREQUENCY CIRCUIT AND CALIBRATION METHOD THEREFOR

(71) Applicant: REALTEK SEMICONDUCTOR CORPORATION, Hsinchu (TW)

(72) Inventor: Sie-Siou Jhang Jian, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 62 days.

(21) Appl. No.: 18/374,365

(22) Filed: Sep. 28, 2023

(65) Prior Publication Data
US 2024/0154851 A1    May 9, 2024

(30) Foreign Application Priority Data
Nov. 7, 2022   (TW) .................................. 111142427

(51) Int. Cl.
*H04L 27/36* (2006.01)
*H03M 1/66* (2006.01)

(52) U.S. Cl.
CPC ............ *H04L 27/364* (2013.01); *H03M 1/66* (2013.01)

(58) Field of Classification Search
CPC ......... H04L 27/32; H04L 27/34; H04L 27/36; H04L 27/362; H04L 27/364; H04L 27/14;
(Continued)

(56) References Cited

U.S. PATENT DOCUMENTS 4,843,351 A * 6/1989 Edwards ............... H04L 27/364
                                                375/298
6,154,158 A * 11/2000 Walker ................ H03M 1/0607
                                                341/118
(Continued)

OTHER PUBLICATIONS

1) OA letter of a counterpart TW application (appl. No. 111142427) mailed on Mar. 20, 2023.2) Summary of the TW OA letter in regard to the TW counterpart application:(1) The specification is objected to under Patent Law Article 26(1) as allegedly being indefinite.(2) Claim(s) 1-10 are allowed.Claim correspondence between the TW counterpart application and the instant US application:Claims 1-10 in the TW counterpart application correspond to claims 1-10 in the instant US application, respectively.

*Primary Examiner* — James M Perez
(74) *Attorney, Agent, or Firm* — WPAT, PC

(57) ABSTRACT

A method of calibrating a radio frequency (RF) circuit that includes an in-phase path (I-path) and a quadrature-phase path (Q-path) is provided. The I-path includes a first modulator and a first component, and the Q-path includes a second modulator and a second component. The modulators and the components respectively include a current DAC (IDAC). The calibration method includes: calibrating DC offsets of the first and second modulators to obtain a first setting value; swapping the I-path and the Q-path, and calibrating DC offsets of the first and second modulators again to obtain a second setting value; setting the IDACs of the first and second modulators with a value of a function of the first and second setting values; calibrating DC offsets of the first and second components; calibrating DC offsets of the first and second modulators; and calibrating DC offsets of the first and second components.

20 Claims, 13 Drawing Sheets

(58) Field of Classification Search
CPC ......... H04L 27/142; H04L 1/24; H04L 1/242; H04L 1/243; H03M 1/66; H03M 1/30; H03M 1/39; H03M 1/40
See application file for complete search history.

(56) References Cited

U.S. PATENT DOCUMENTS

| | | | | |
|---|---|---|---|---|
| 7,095,348 | B1* | 8/2006 | Sutardja | H03M 1/0863 |
| | | | | 375/259 |
| 7,194,037 | B1* | 3/2007 | Sutardja | H03M 1/0626 |
| | | | | 375/219 |
| 7,363,563 | B1* | 4/2008 | Hissen | H04L 1/243 |
| | | | | 327/144 |
| 7,558,556 | B1* | 7/2009 | Moloudi | H04B 1/40 |
| | | | | 327/267 |
| 7,733,949 | B2* | 6/2010 | Jin | H04B 17/354 |
| | | | | 379/3 |
| 8,170,506 | B2* | 5/2012 | Ahrari | H04L 25/061 |
| | | | | 455/114.2 |
| 8,340,167 | B2* | 12/2012 | Feng | H04B 17/21 |
| | | | | 375/325 |
| 8,503,926 | B2* | 8/2013 | Gainey | H04L 27/3863 |
| | | | | 370/316 |
| 9,088,319 | B2* | 7/2015 | Peng | H03F 1/3241 |
| 9,276,602 | B1* | 3/2016 | Pagnanelli | H03M 1/1038 |
| 9,325,553 | B2* | 4/2016 | Kaukovuori | H04J 11/0063 |
| 9,729,119 | B1* | 8/2017 | Blatz | H03G 3/3084 |
| 9,780,891 | B2* | 10/2017 | Eo | H04B 17/0085 |
| 9,893,924 | B2* | 2/2018 | Smail | H04L 27/3881 |
| 10,063,203 | B1* | 8/2018 | Harwalkar | H03G 3/20 |
| 10,069,577 | B1* | 9/2018 | Kuan | H03D 3/009 |
| 10,097,284 | B1* | 10/2018 | Kuan | H04B 1/30 |
| 10,164,593 | B1* | 12/2018 | Harwalkar | H03G 3/20 |
| 10,374,838 | B2* | 8/2019 | Jiang | H03F 3/245 |
| 10,587,303 | B2* | 3/2020 | Jhang Jian | H04B 1/44 |
| 10,727,854 | B1* | 7/2020 | Greshishchev | H03M 1/1215 |
| 10,879,923 | B1* | 12/2020 | Chakraborty | H03M 1/662 |
| 11,057,123 | B1* | 7/2021 | Chang | H04B 1/38 |
| 11,368,143 | B1* | 6/2022 | Chakraborty | G06F 1/08 |
| 11,379,186 | B2* | 7/2022 | Chakraborty | G06F 7/5443 |
| 11,515,901 | B1* | 11/2022 | Toosi | H04B 1/3827 |
| 11,539,560 | B2* | 12/2022 | Jany | H03B 5/1215 |
| 11,664,906 | B2* | 5/2023 | Chang | H04B 1/0483 |
| | | | | 375/262 |
| 11,683,026 | B1* | 6/2023 | Chakraborty | H03K 5/01 |
| | | | | 327/527 |
| 12,126,407 | B2* | 10/2024 | Zhang | H04B 7/043 |
| 2003/0087614 | A1* | 5/2003 | Kramer | H03C 3/40 |
| | | | | 455/112 |
| 2005/0239428 | A1* | 10/2005 | Seendripu | H04B 1/30 |
| | | | | 455/313 |
| 2006/0255997 | A1* | 11/2006 | Li | H03F 3/24 |
| | | | | 341/156 |
| 2008/0137777 | A1* | 6/2008 | Behzad | H04L 27/364 |
| | | | | 375/319 |
| 2008/0181337 | A1* | 7/2008 | Maxim | H03M 1/0614 |
| | | | | 455/230 |
| 2009/0154595 | A1* | 6/2009 | Choksi | H04L 5/1461 |
| | | | | 375/295 |
| 2010/0026383 | A1* | 2/2010 | Ahrari | H04L 25/061 |
| | | | | 327/551 |
| 2010/0120369 | A1* | 5/2010 | Ko | H03D 7/168 |
| | | | | 455/67.11 |
| 2010/0302083 | A1* | 12/2010 | Helfenstein | H04L 27/364 |
| | | | | 341/118 |
| 2011/0006826 | A1* | 1/2011 | Kang | H03H 11/22 |
| | | | | 327/254 |
| 2015/0030103 | A1* | 1/2015 | Hormis | H04L 1/243 |
| | | | | 375/296 |
| 2015/0070202 | A1* | 3/2015 | Dedic | H03M 1/0624 |
| | | | | 327/109 |
| 2015/0103948 | A1* | 4/2015 | Drees | H04L 27/14 |
| | | | | 375/296 |
| 2015/0271005 | A1* | 9/2015 | Wang | H04L 27/364 |
| | | | | 375/254 |
| 2015/0381401 | A1* | 12/2015 | Butterfield | H03F 1/02 |
| | | | | 375/295 |
| 2017/0077945 | A1* | 3/2017 | Pagnanelli | H03F 3/45475 |
| 2018/0198661 | A1* | 7/2018 | Palmers | H03M 1/1047 |
| 2018/0248742 | A1* | 8/2018 | Lei | H04B 1/30 |
| 2018/0358883 | A1* | 12/2018 | Saputra | H03M 1/00 |
| 2020/0007378 | A1* | 1/2020 | Vergel | G01R 31/3171 |
| 2020/0036408 | A1* | 1/2020 | Jhang Jian | H04B 1/44 |
| 2020/0177417 | A1* | 6/2020 | Tangudu | H04B 1/30 |
| 2021/0208848 | A1* | 7/2021 | Chakraborty | H03M 1/66 |
| 2023/0117775 | A1* | 4/2023 | Jhang-Jian | H04B 1/123 |
| | | | | 455/552.1 |
| 2023/0403022 | A1* | 12/2023 | Zhou | H03M 1/1042 |
| 2023/0421189 | A1* | 12/2023 | Kuncham | H03D 7/1441 |
| 2023/0421428 | A1* | 12/2023 | Agrawal | H04L 27/364 |
| 2024/0022248 | A1* | 1/2024 | Pellerano | H03F 3/21 |
| 2024/0154851 | A1* | 5/2024 | Jhang Jian | H04L 27/364 |
| 2024/0162921 | A1* | 5/2024 | Chakraborty | H04B 1/0028 |
| 2024/0163155 | A1* | 5/2024 | Abdellatif | H04L 27/36 |
| 2024/0204753 | A1* | 6/2024 | Gazzerro | H03H 11/0461 |
| 2024/0283473 | A1* | 8/2024 | Chamas | H04B 1/30 |

* cited by examiner

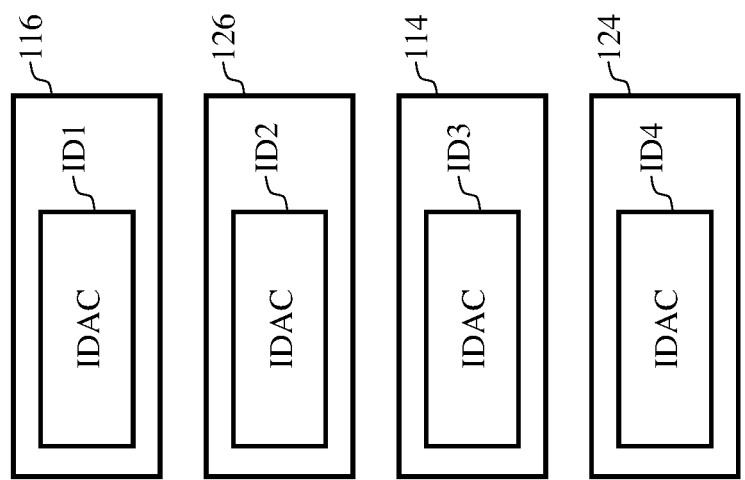

S610 — in a calibration interval, finding a target setting value by interpolation or scanning all the digital codes

FIG. 6

RADIO FREQUENCY CIRCUIT AND CALIBRATION METHOD THEREFOR

BACKGROUND OF THE INVENTION

1. Field of the Invention

The present invention generally relates to electronic devices, and, more particularly, to radio frequency (RF) circuits and calibration methods therefor.

2. Description of Related Art

Quadrature amplitude modulation (QAM) is often used in wireless devices, and a radio frequency (RF) circuit of the wireless devices often encounters imbalance between an in-phase path (I-path) and a quadrature-phase path (Q-path) (i.e., the In-phase Quadrature-phase imbalance), which is referred to as IQ imbalance. The IQ imbalance (in particular, an unmatched direct current (DC) offset) causes leakage of local oscillator (LO) signals from the RF circuit.

SUMMARY OF THE INVENTION

In view of the issues of the prior art, an object of the present invention is to provide radio frequency (RF) circuits and calibration methods therefor, so as to make an improvement to the prior art.

According to one aspect of the present invention, a calibration method for a radio frequency (RF) circuit is provided. The RF circuit includes an in-phase path and a quadrature-phase path. The in-phase path includes a first modulator and a first component. The quadrature-phase path includes a second modulator and a second component. The first modulator, the second modulator, the first component, and the second component respectively include a first current digital-to-analog converter (IDAC), a second IDAC, a third IDAC, and a fourth IDAC. The calibration method includes the following steps: (A) calibrating direct current (DC) offsets of the first modulator and the second modulator to obtain a first target setting value for the first IDAC and the second IDAC; (B) swapping the in-phase path and the quadrature-phase path, and then calibrating the DC offsets of the first modulator and the second modulator again to obtain a second target setting value for the first IDAC and the second IDAC; (C) setting the first IDAC and the second IDAC with a value of a function of the first target setting value and the second target setting value; (D) calibrating DC offsets of the first component and the second component to obtain a third target setting value for the third IDAC and the fourth IDAC; (E) calibrating the DC offsets of the first modulator and the second modulator to obtain a fourth target setting value for the first IDAC and the second IDAC; and (F) calibrating the DC offsets of the first component and the second component to obtain a fifth target setting value for the third IDAC and the fourth IDAC.

According to another aspect of the present invention, a radio frequency (RF) circuit is provided. The RF circuit includes an in-phase path, a quadrature-phase path, and a control circuit. The in-phase path includes a first modulator and a first component. The quadrature-phase path includes a second modulator and a second component. The first modulator, the second modulator, the first component, and the second component respectively include a first current digital-to-analog converter (IDAC), a second IDAC, a third IDAC, and a fourth IDAC. The control circuit performs the following steps to calibrate the RF circuit: (A) calibrating direct current (DC) offsets of the first modulator and the second modulator to obtain a first target setting value for the first IDAC and the second IDAC; (B) swapping the in-phase path and the quadrature-phase path, and then calibrating the DC offsets of the first modulator and the second modulator again to obtain a second target setting value for the first IDAC and the second IDAC; (C) setting the first IDAC and the second IDAC with a value of a function of the first target setting value and the second target setting value; (D) calibrating DC offsets of the first component and the second component to obtain a third target setting value for the third IDAC and the fourth IDAC; (E) calibrating the DC offsets of the first modulator and the second modulator to obtain a fourth target setting value for the first IDAC and the second IDAC; and (F) calibrating the DC offsets of the first component and the second component to obtain a fifth target setting value for the third IDAC and the fourth IDAC.

The technical means embodied in the embodiments of the present invention can solve at least one of the problems of the prior art. Therefore, compared with the prior art, the present invention can calibrate the IQ imbalance of the RF circuits and reduce the leakage of the local oscillator (LO) signals.

These and other objectives of the present invention no doubt become obvious to those of ordinary skill in the art after reading the following detailed description of the preferred embodiments with reference to the various figures and drawings.

BRIEF DESCRIPTION OF THE DRAWINGS

FIG. 1B shows modulators and low-pass filters (LPFs), each including a current digital-to-analog converter (IDAC).

FIG. 6 shows the details of the calibration steps according to an embodiment.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes radio frequency (RF) circuits and calibration methods therefor. On account of that some or all elements of the RF circuits could be known, the detail of such elements is omitted provided that such detail has little to do with the features of this disclosure, and that this omission nowhere dissatisfies the specification and enablement requirements. Some or all of the processes of the calibration methods for the RF circuits may be implemented by software and/or firmware and can be performed by the control circuit or its equivalent. A person having ordinary skill in the art can choose components or steps equivalent to those described in this specification to carry out the present invention, which means that the scope of this invention is not limited to the embodiments in the specification.

Figure 1A:
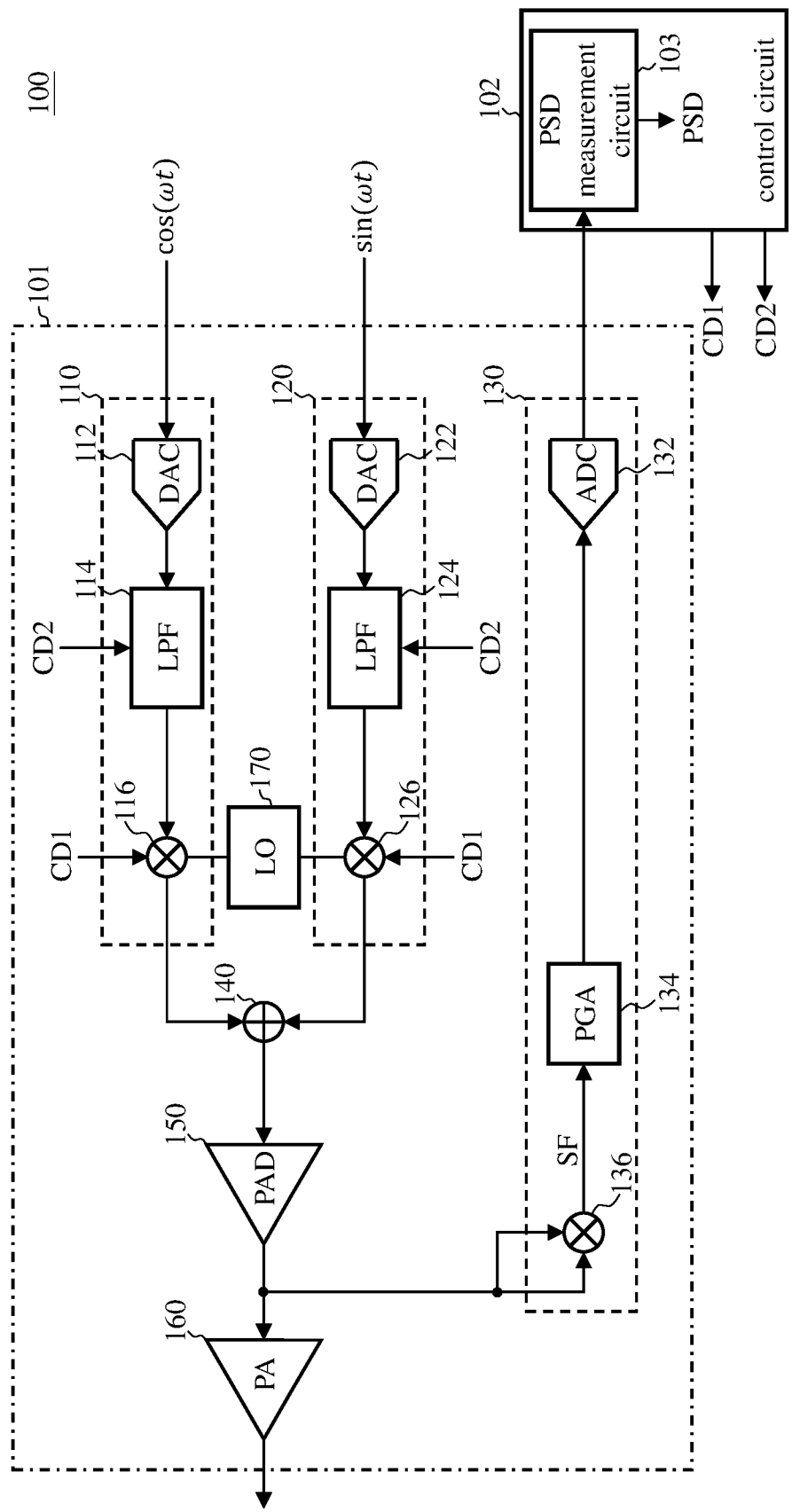
FIG. 1A is a functional block diagram of an electronic device according to an embodiment of the present invention.

FIG. 1A is a functional block diagram of an electronic device 100 according to an embodiment of the present invention. The electronic device 100 includes an RF circuit 101 and a control circuit 102. The RF circuit 101 includes an I-path 110, a Q-path 120, a feedback path 130, an adder circuit 140, a power amplifier driver (PAD) 150, a power amplifier (PA) 160, and a local oscillator (LO) 170. The I-path 110 includes a digital-to-analog converter (DAC) 112, a low-pass filter (LPF) 114, and a modulator (also referred to as a mixer) 116. The Q-path 120 includes a DAC 122, an LPF 124, and a modulator 126. The feedback path 130 includes an analog-to-digital converter (ADC) 132, a Power Gain Amplifier (PGA) 134, and a self-mixer 136. Principle and operational details of the RF circuit 101 are well known to people having ordinary skill in the art, so the details are thus omitted for brevity.

The control circuit 102 includes a power spectral density (PSD) measurement circuit 103. The PSD measurement circuit 103 is used for measuring a power spectral density of a feedback signal. The control circuit 102 adjusts (or generates) a digital code CD1 and a digital code CD2 according to a power spectral density PSD outputted by the PSD measurement circuit 103. The control circuit 102 sets current digital-to-analog converters (IDACs) of the modulator 116 and the modulator 126 through the digital code CD1. The control circuit 102 sets the IDACs of the LPF 114 and the LPF 124 through the digital code CD2.

Figure 2:
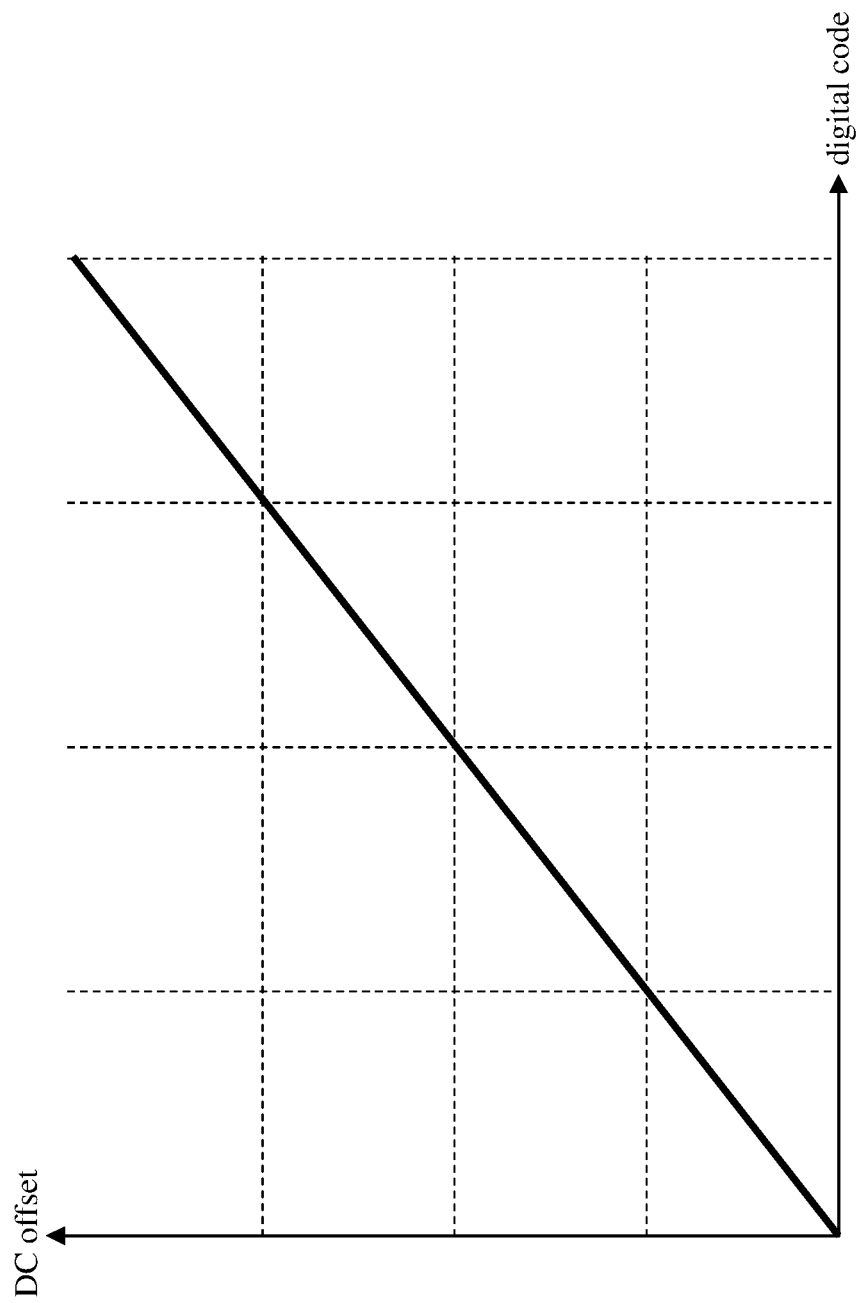
FIG. 2 shows an ideal relationship between the direct current (DC) offset and the digital code for an IDAC.
Figure 3:
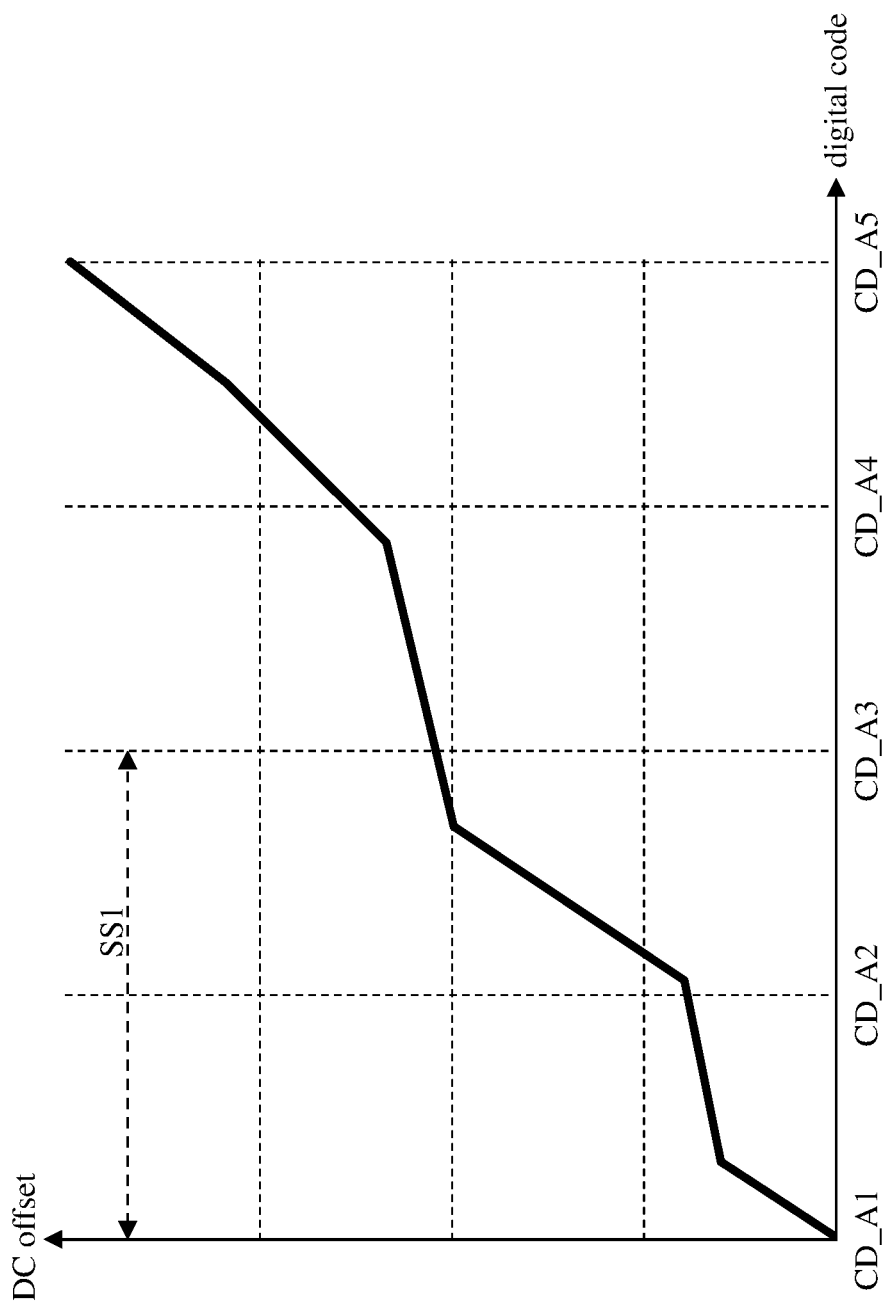
FIG. 3 and FIG. 4 show the actual relationship between the DC offset and the digital code for an IDAC.
Figure 4:
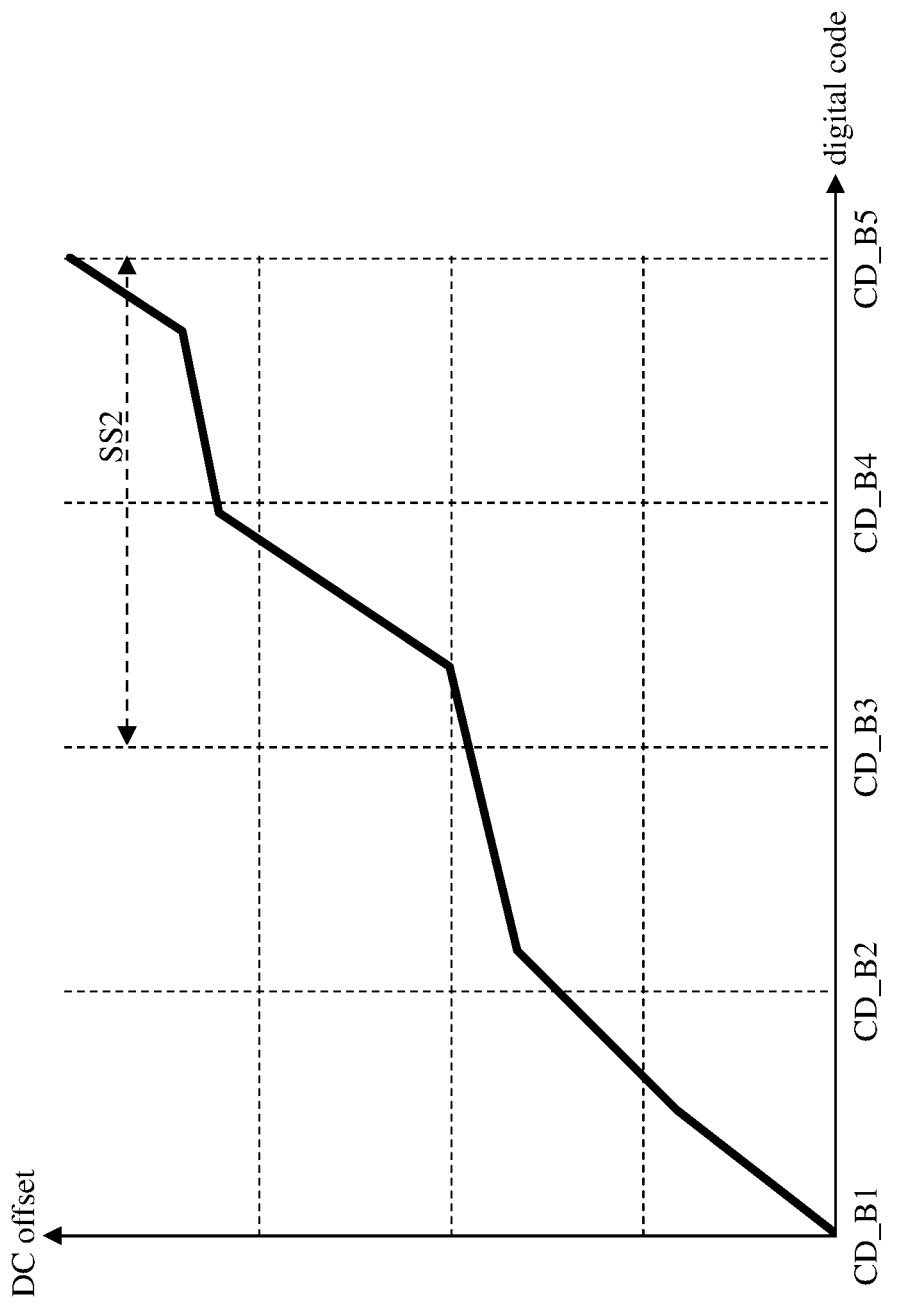

Reference is made to FIG. 1B, which shows the modulator 116, the modulator 126, the LPF 114, and the LPF 124, each including an IDAC (IDAC ID1, IDAC ID2, IDAC ID3, and IDAC ID4). Detailed circuits and operating principles of an IDAC are well known to people having ordinary skill in the art, so the details are thus omitted for brevity. Ideally, the relationship between a DC offset and a digital code (i.e., the setting value) of the IDACs is linear (as shown in FIG. 2). However, due to some factors such as process variation, relationship between an actual DC offset and a digital code of these components may be non-linear. For example, characteristic of the IDAC ID1 of the modulator 116 and characteristic of the IDAC ID2 of the modulator 126 may be non-linear (an example of which is shown in FIG. 3, although in practical there might be slight differences between these two characteristics), and characteristic of the IDAC ID3 of the LPF 114 and characteristic of the IDAC ID4 of the LPF 124 may be non-linear (an example of which is shown in FIG. 4, although in practical there might be slight differences between these two characteristics). Therefore, the LPF 114, the modulator 116, the LPF 124, and the modulator 126 should be calibrated (e.g., by adjusting the digital codes) so that the I-path 110 and the Q-path 120 better match each other with respect to the DC offset (e.g., closer to a target value), thereby preventing leakage of a LO signal of the LO 170.

Reference is made to FIG. 3. For the modulator 116 and the modulator 126, minimum and maximum values of the digital codes of the IDAC are a digital code CD_A1 and a digital code CD_A5, respectively. A digital code CD_A2, a digital code CD_A3, and a digital code CD_A4 may be approximately 1/4, 2/4, and 3/4 of the digital code CD_A5, respectively. Reference is made to FIG. 4. For the LPF 114 and the LPF 124, minimum and maximum values of the digital codes of the IDAC are a digital code CD_B1 and a digital code CD_B5, respectively. A digital code CD_B2, a digital code CD_B3, and a digital code CD_B4 may be approximately 1/4, 2/4, and 3/4 of the digital code CD_B5, respectively.

In FIG. 3 and FIG. 4, the digital codes are divided into 4 intervals. However, this is for illustration purposes only and is not a limitation of the scope of the invention. In an alternative embodiment, the digital codes can be divided into N intervals (N is an integer greater than or equal to 2).

Note that, please refer to FIG. 3 and FIG. 4, the digital code range ([CD_A1,CD_A5]) of the IDAC of the LPF 114 (124) may or may not be the same as the digital code range ([CD_B1,CD_B5]) of the IDAC of the modulator 116 (126). For example, if the digital code of the IDAC of the LPF 114 (124) is X bits (i.e., $CD\_A5=2^X-1$), and the digital code of the IDAC of the modulator 116 (126) is Y bits (i.e., $CD\_B5=2^Y-1$), then X=Y or X≠Y (X and Y are integers greater than or equal to 2).

Figure 5A:
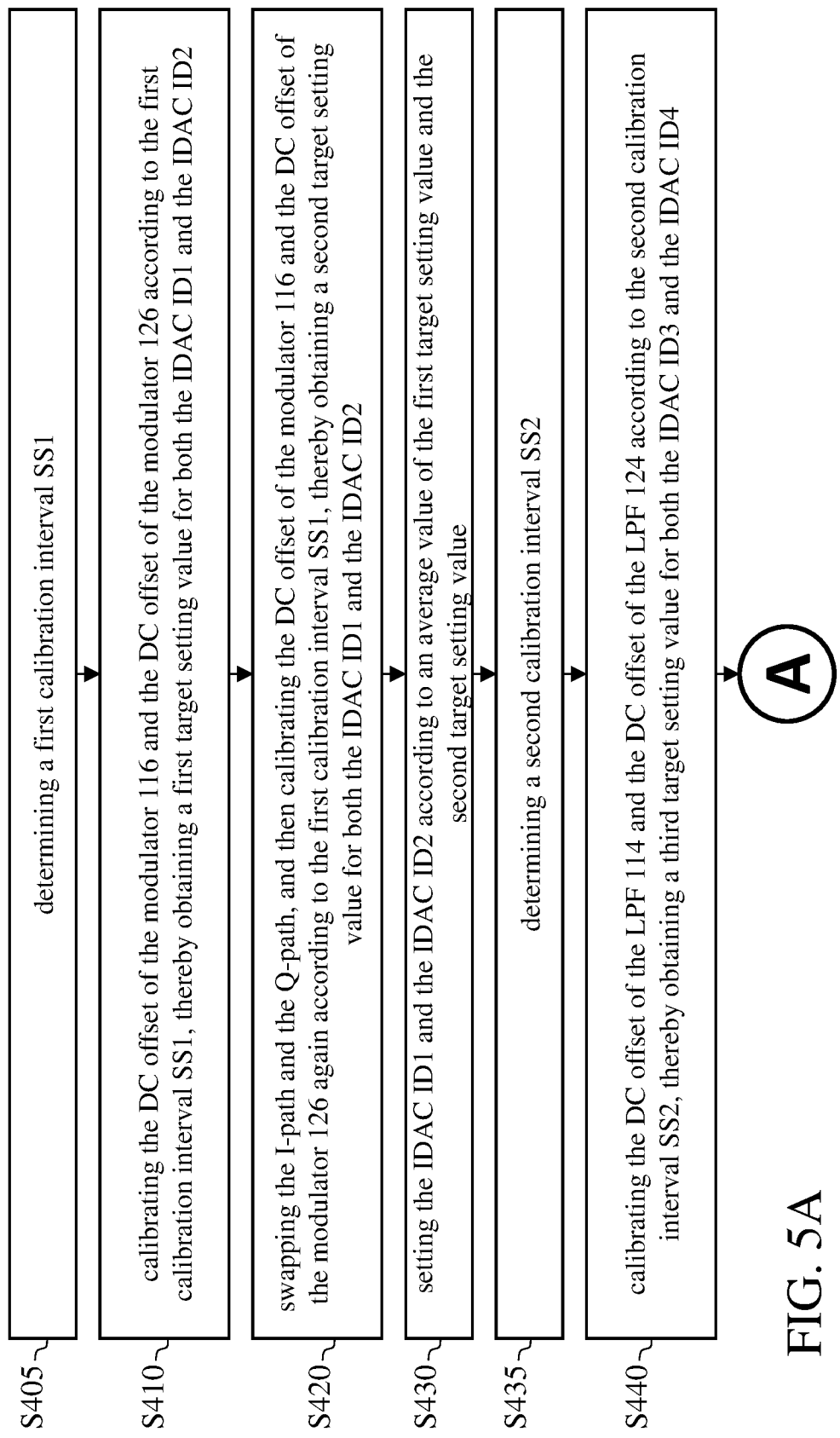
FIGS. 5A and 5B show a flowchart of a calibration method for a radio frequency (RF) circuit according to an embodiment of the present invention.
Figure 5B:
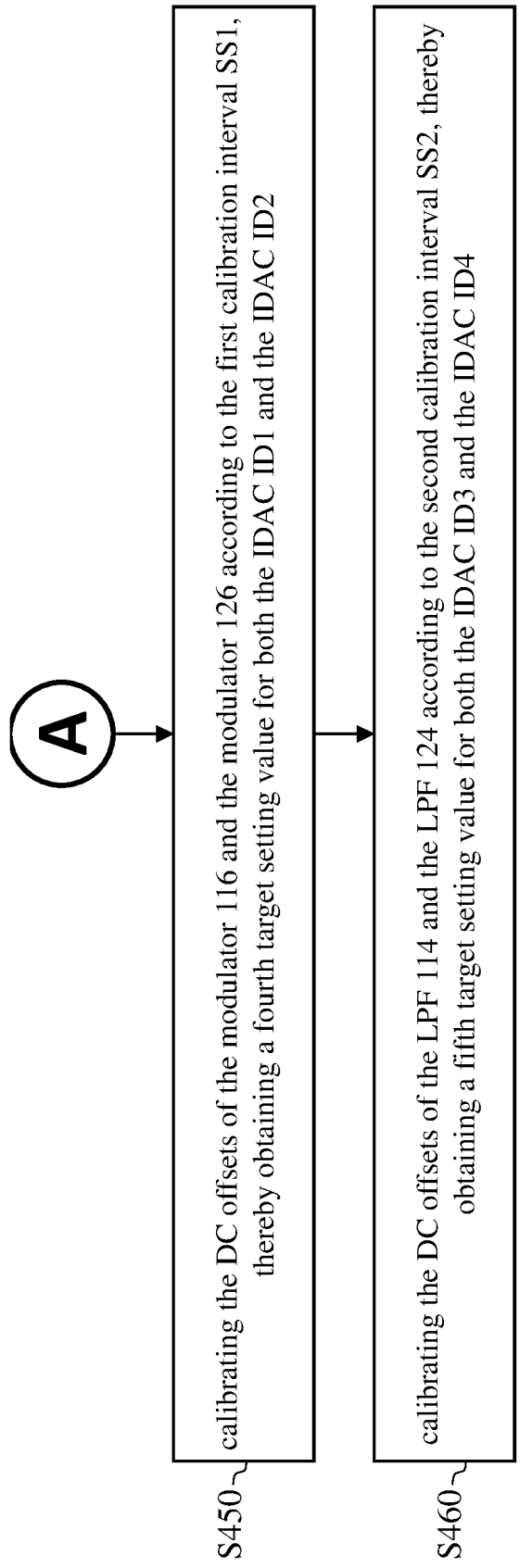

FIG. 5A, FIG. 5B, and FIG. 6 show the flowchart of the calibration method for the RF circuit according to an embodiment of the present invention and include the following steps.

Step S405: The control circuit 102 determines a first calibration interval SS1. More specifically, in reference to FIG. 3, the control circuit 102 determines the first calibration interval SS1 according to the range of the digital codes (i.e., [CD_A1,CD_A5]). The first calibration interval SS1 can be a full range (i.e., SS1=[CD_A1,CD_A5]) or a partial range (e.g., SS1=[CD_A1,CD_A4] or SS1=[CD_A3,CD_A5]) of the digital codes. In the example of FIG. 3, the first calibration interval SS1 is [CD_A1,CD_A3] (i.e., CD_A1≤CD1≤CD_A3). In some embodiments, the control circuit 102 determines the first calibration interval SS1 according to experience or the characteristic of the modulator 116 (126).

Step S410: The control circuit 102 calibrates the DC offset of the modulator 116 and the DC offset of the modulator 126 according to the first calibration interval SS1, thereby obtaining a first target setting value (CT1) for both the IDAC ID1 and the IDAC ID2. In some embodiments, step S410 includes decreasing gains of the LPF 114 and the LPF 124 (e.g., to their minimum value) to reduce influence of the LPF 114 and the LPF 124 on a signal.

Reference is made to FIG. 6, which shows implementation details of step S410 according to an embodiment.

Step S610: In a calibration interval (e.g., the first calibration interval SS1), the control circuit 102 finds a target setting value for the digital code CD1 (e.g., the first target setting value (CT1) in step S410) by interpolation or scanning all the digital codes. The target setting value corresponds to a relatively small image signal (i.e., the power spectral density PSD of the image signal is relatively small).

Continue with FIG. 5A.

Step S420: The control circuit 102 swaps the I-path and the Q-path, and then calibrates the DC offset of the modulator 116 and the DC offset of the modulator 126 again according to the first calibration interval SS1, thereby obtaining a second target setting value (CT2) for both the IDAC ID1 and the IDAC ID2. Step S420 is similar to step S410 (i.e., the implementation details of step S420 can refer to step S610), but the control circuit 102 first controls the I-path and the Q-path to swap (e.g., by controlling the switch of the LPF 114/124 or the modulator 116/126), and then performs the calibration operation. The purpose of swapping the I-path and the Q-path is to exclude the DC offset of the component in a previous stage (e.g., a baseband circuit (not shown)), and swapping the I-path and the Q-path is well known to people having ordinary skill in the art, so the details are thus omitted for brevity.

Similarly, in some embodiments, step S420 includes decreasing the gains of the LPF 114 and the LPF 124.

Step S430: The control circuit 102 sets the IDAC ID1 of the modulator 116 and the IDAC ID2 of the modulator 126 according to a value of a function of the first target setting value (CT1) and the second target setting value (CT2) (e.g., an average value or a function value similar to the average value). For example, the control circuit 102 sets the IDAC ID1 and the IDAC ID2 to (CT1+CT2)/2, so that a DC offset of a component in the previous stage can be excluded to prevent it from affecting the calibration of the RF circuit 101.

Step S435: The control circuit 102 determines a second calibration interval SS2. Step S435 is similar to step S405. Reference is made to FIG. 4. In the example of FIG. 4, the second calibration interval SS2 is [CD_B3,CD_B5] (i.e., CD_B3≤CD2≤CD_B5). In some embodiments, the control circuit 102 determines the second calibration interval SS2 according to experience or the characteristic of the LPF 114 (124).

Step S440: The control circuit 102 calibrates the DC offset of the LPF 114 and the DC offset of the LPF 124 according to the second calibration interval SS2, thereby obtaining a third target setting value (CT3) for both the IDAC ID3 and the IDAC ID4. Similar to step S410, the implementation details of step S440 can refer to step S610. In some embodiments, if the control circuit 102 decreases the gains of the LPF 114 and the LPF 124 in steps S410 and S420, the control circuit 102 increases the gains of the LPF 114 and the LPF 124 in step S440 (for example, to the maximum value).

Reference is made to FIG. 5B for the discussion below. Since the LPF 114 and the LPF 124 are calibrated in step S440, the modulator 116 and the modulator 126 need to be calibrated again (step S450). Furthermore, since the modulator 116 and the modulator 126 are calibrated in step S450, the LPF 114 and the LPF 124 need to be calibrated again (step S460).

Step S450: The control circuit 102 calibrates the DC offsets of the modulator 116 and the modulator 126 according to the first calibration interval SS1, thereby obtaining a fourth target setting value (CT4) for both the IDAC ID1 and the IDAC ID2. For the implementation details of step S450, reference may be made to step S610. Similarly, in some embodiments, step S450 includes decreasing the gains of the LPF 114 and the LPF 124.

Step S460: The control circuit 102 calibrates the DC offsets of the LPF 114 and the LPF 124 according to the second calibration interval SS2, thereby obtaining a fifth target setting value (CT5) for both the IDAC ID3 and the IDAC ID4. For the implementation details of step S460, reference may be made to step S610. In some embodiments, if the control circuit 102 decreases the gains of the LPF 114 and the LPF 124 in step S450, the control circuit 102 increases the gains of the LPF 114 and the LPF 124 in step S460.

In summary, after two calibrations of the modulator 116 and the modulator 126 (including steps S410 to S430 and S450) and two calibrations of the LPF 114 and the LPF 124 (including steps S440 and S460), the IQ imbalance of the RF circuit 101 can be calibrated to reduce the leakage of the LO signal.

Figure 7:
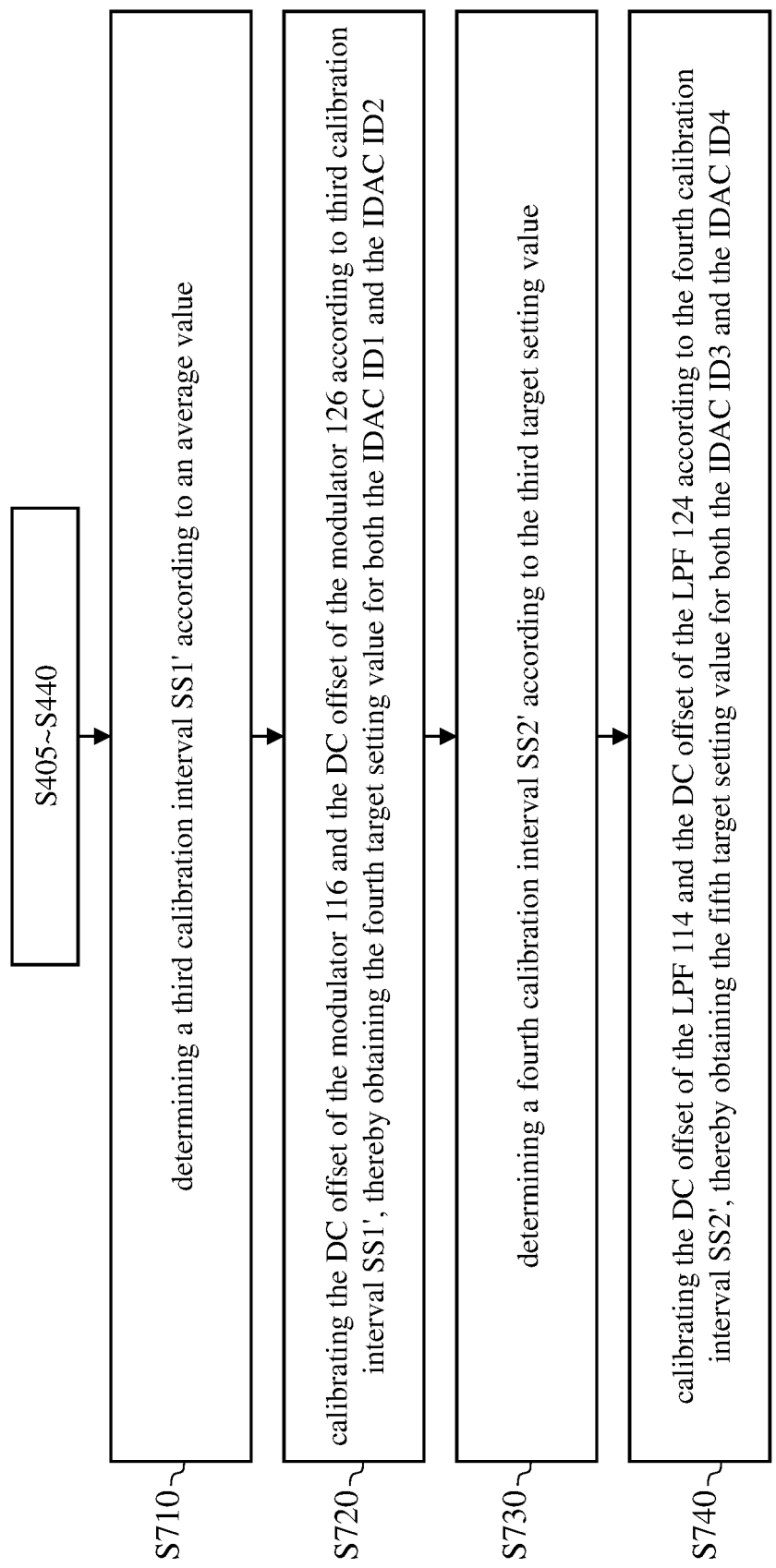
FIG. 7 shows a flowchart of a calibration method for an RF circuit according to another embodiment of the present invention.

FIG. 7 shows a flowchart of a calibration method for an RF circuit according to another embodiment of the present invention and include the following steps.

Steps S405-S440: Please refer to the flowchart of FIG. 5A and related discussions.

Figure 8:
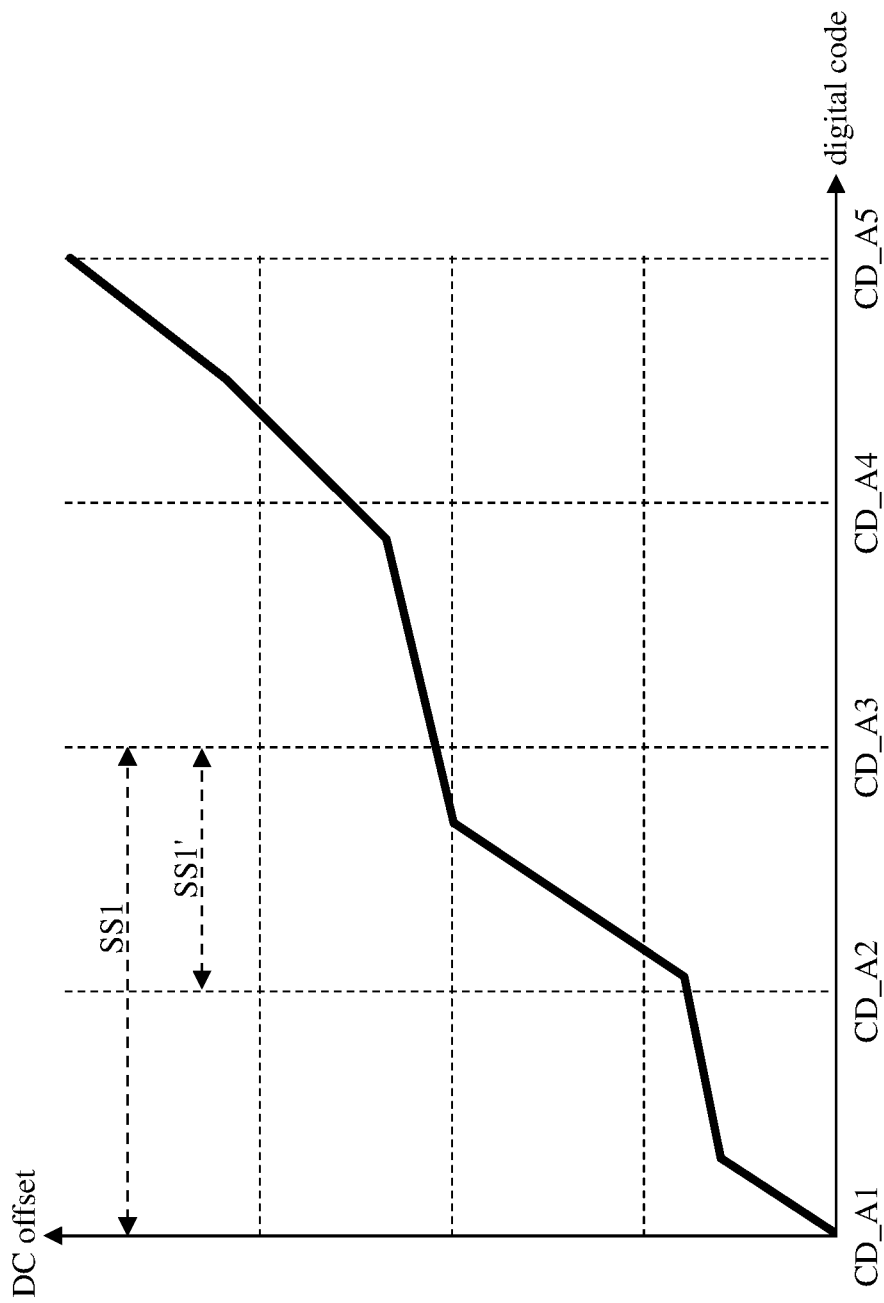
FIGS. 8 and 9 show the actual relationship between the DC offset and the digital code for an IDAC.

Step S710: The control circuit 102 determines a third calibration interval SS1' according to an average value (i.e., the average value (CT1+CT2)/2 in step S430). The third calibration interval SS1' is smaller than the first calibration interval SS1 in step S410 and step S420 (i.e., SS1'<SS1). More specifically, in reference to FIG. 8 (which corresponds to FIG. 3), in the example of FIG. 8, it is assumed that the average value ((CT1+CT2)/2) is greater than the digital code CD_A2 (i.e., CD_A2<(CT1+CT2)/2≤CD_A3), so the control circuit 102 determines the third calibration interval SS1' to be [CD_A2,CD_A3]. However, if the average value ((CT1+CT2)/2) is less than or equal to the digital code CD_A2 (i.e., CD_A1≤(CT1+CT2)/2≤CD_A2), the control circuit 102 determines the third calibration interval SS1' to be [CD_A1,CD_A2].

Step S720: The control circuit 102 calibrates the DC offset of the modulator 116 and the DC offset of the modulator 126 according to third calibration interval SS1', thereby obtaining the fourth target setting value (CT4) for both the IDAC ID1 and the IDAC ID2. Step S720 is similar to step S450 except that step S720 performs the calibration according to third calibration interval SS1' (i.e., for the example in FIG. 8, CD_A2≤CD1≤CD_A3). The third calibration interval SS1' is smaller than the first calibration interval SS1 (i.e., there are fewer candidate digital codes). Therefore, compared with step S450, step S720 can obtain the fourth target setting value (CT4) faster, and the interpolation method is more accurate (i.e., the fourth target setting value (CT4) is more accurate).

Figure 9:
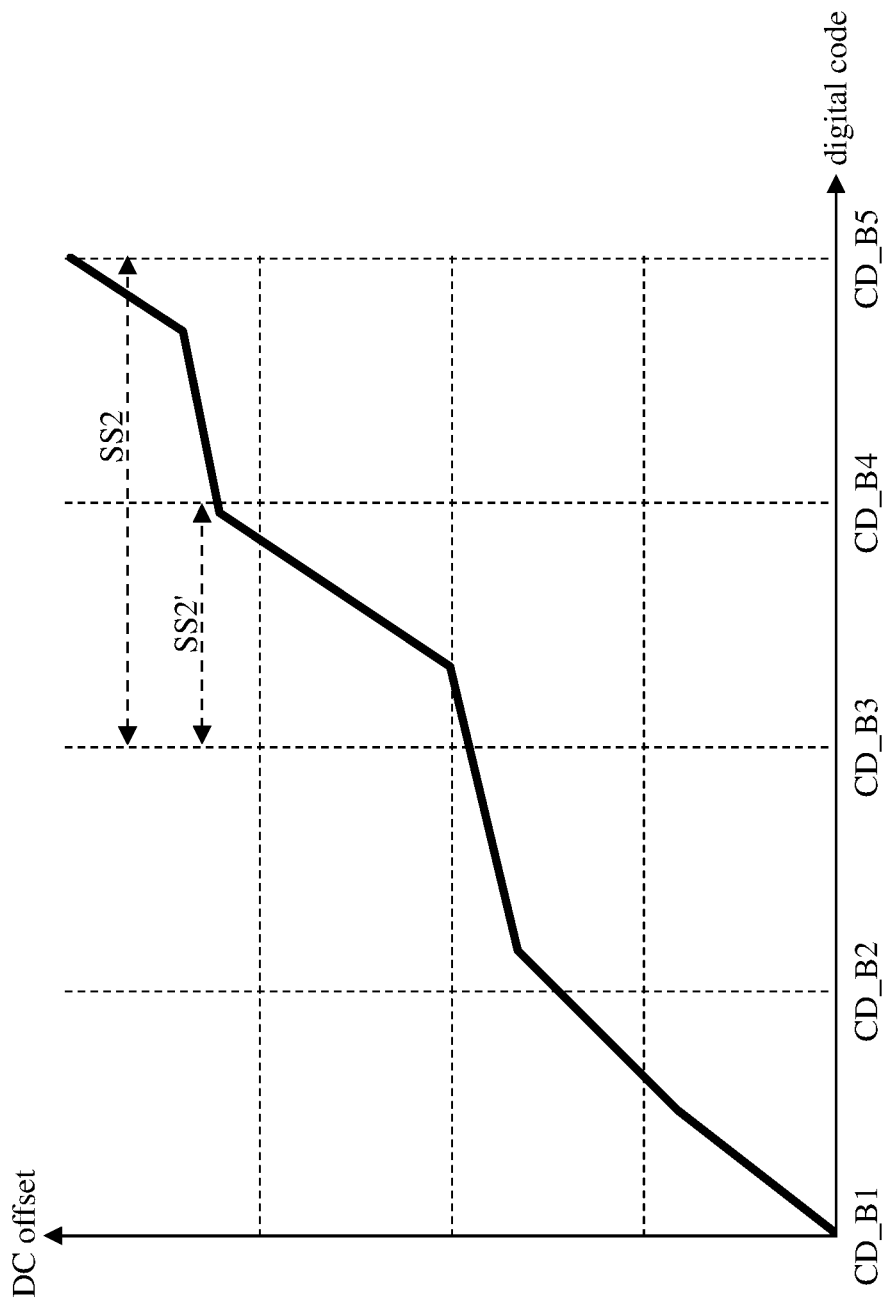

Step S730: The control circuit 102 determines a fourth calibration interval SS2' according to the third target setting value (CT3). Step S730 is similar to step S710. The fourth calibration interval SS2' is smaller than the second calibration interval SS2 in step S440 (i.e., SS2'<SS2). More specifically, in reference to FIG. 9 (which corresponds to FIG. 4), in the example of FIG. 9, it is assumed that the third target setting value (CT3) is less than or equal to the digital code CD_B4 (i.e., CD_B3≤CT3≤CD_B4), so the control circuit 102 determines the fourth calibration interval SS2' to be [CD_B3,CD_B4].

Step S740: The control circuit 102 calibrates the DC offset of the LPF 114 and the DC offset of the LPF 124 according to the fourth calibration interval SS2', thereby obtaining the fifth target setting value (CT5) for both the IDAC ID3 and the IDAC ID4. Step S740 is similar to step S460 except that step S740 performs the calibration according to the fourth calibration interval SS2' (i.e., for the example in FIG. 9, CD_B3≤CD2≤CD_B4). Compared with step S460, step S740 can obtain the fifth target setting value (CT5) more quickly, and the interpolation method is more accurate (i.e., the fifth target setting value (CT5) is more accurate).

To sum up, in the embodiment of FIG. 7, since the calibration interval (i.e., the third calibration interval SS1' or the fourth calibration interval SS2') used for the second calibration (i.e., step S720 or step S740) is smaller than the calibration interval (i.e., the first calibration interval SS1 or the second calibration interval SS2) used for the first calibration (i.e., steps S410 to S420 or step S440), the second calibration converges faster (i.e., the fourth target setting value (CT4) or the fifth target setting value (CT5) is obtained more quickly), which accelerates the overall calibration process of the RF circuit 101.

Figure 10A:
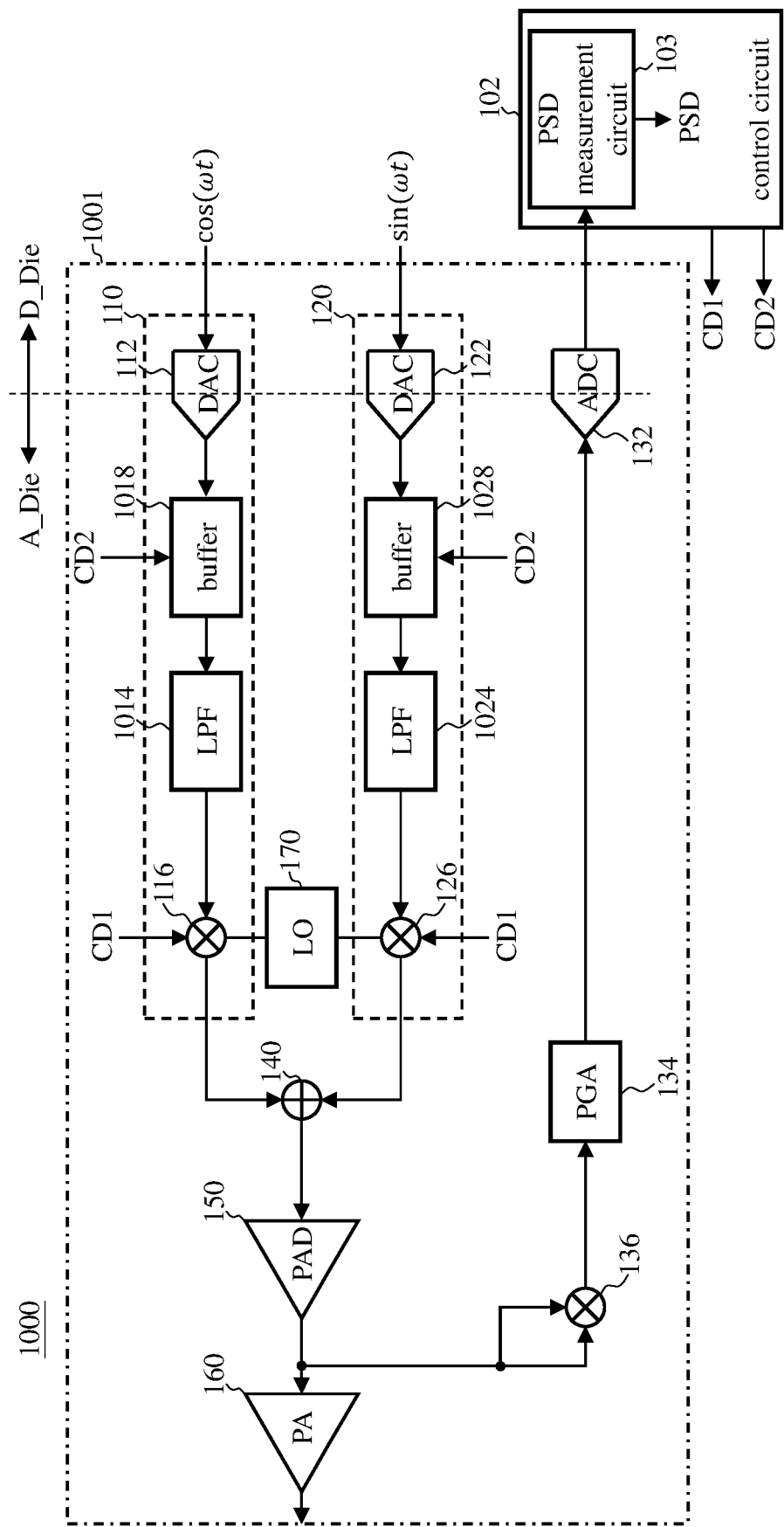
FIG. 10A is a functional block diagram of an electronic device according to another embodiment of the present invention.

Reference is made to FIG. 10A, which is a functional block diagram of an electronic device according to another embodiment of the present invention. The electronic device 1000 is similar to the electronic device 100, except that the LPF 1014 and the LPF 1024 are passive components (which do not include IDACs), and the I-path 110 and the Q-path 120 of the RF circuit 1001 further include a buffer 1018 and a buffer 1028, respectively. The electronic device 1000 is a combination of an analog die A_Die and a digital die D_Die, and the buffer 1018 and the buffer 1028 are used to ensure correct data transfer between the digital die D_Die and the analog die A_Die.

Figure 10B:
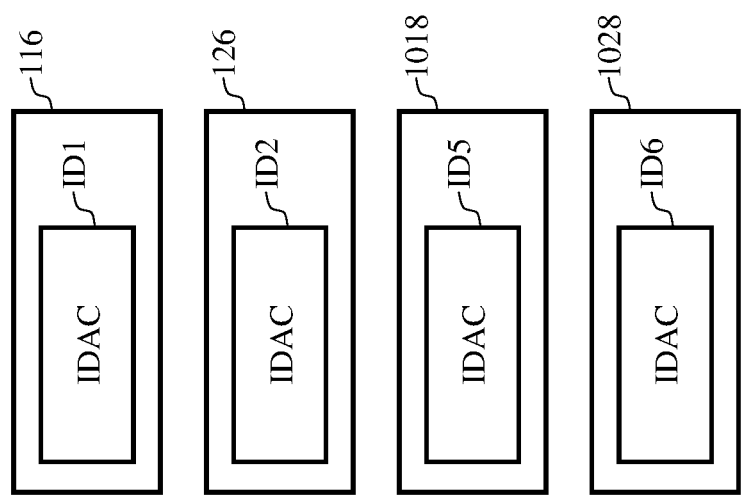
FIG. 10B shows modulators and buffers, each including an IDAC.

Reference is made to FIG. 10B, which shows that the modulator 116, the modulator 126, the buffer 1018, and the buffer 1028 each include an IDAC (IDAC ID1, IDAC ID2, IDAC ID5, and IDAC ID6, respectively).

Since the buffer 1018 and the buffer 1028 each include an IDAC, the RF circuit 1001 of FIG. 10A can also be calibrated according to the above calibration method. More specifically, by simply replacing the LPF 114 and the LPF 124 in steps S440, S460, and S740 with the buffer 1018 and the buffer 1028, respectively, and replacing the IDAC ID3 and the IDAC ID4 with the IDAC ID5 and the IDAC ID6, respectively, the calibration method of FIGS. 5A-5B or FIG. 7 can be applied to the RF circuit 1001.

Note that the entire calibration process of the RF circuit 101 or the RF circuit 1001 can be accelerated and/or the accuracy of the interpolation method can be improved by reducing at least one of the first calibration interval SS1 and the second calibration interval SS2. In other words, in an alternative embodiment, the control circuit 102 performs steps S405 to S440, step S710, step S720, and step S460 (i.e., only reducing the first calibration interval SS1 to the third calibration interval SS1', but not reducing the second calibration interval SS2). In another alternative embodiment, the control circuit 102 performs steps S405 to S440, step S450, step S730, and step S740 (i.e., only reducing the second calibration interval SS2 to the fourth calibration interval SS2', but not reducing the first calibration interval SS1).

People having ordinary skill in the art can design the control circuit 102 according to the above description, that is, the control circuit 102 can be an application specific integrated circuit (ASIC) or can be embodied by circuitry or hardware such as a programmable logic device (PLD).

The modulators, the LPFs, and the buffers are intended to illustrate the invention by way of example and not to limit the scope of the claimed invention. People having ordinary skill in the art may apply the present invention to other components with IDACs in accordance with the foregoing discussions.

Since a person having ordinary skill in the art can appreciate the implementation detail and the modification thereto of the present method invention through the disclosure of the device invention, repeated and redundant description is thus omitted. Please note that the shape, size, and ratio of any element in the disclosed figures are exemplary for understanding, not for limiting the scope of this invention. Furthermore, there is no step sequence limitation for the method inventions as long as the execution of each step is applicable. In some instances, the steps can be performed simultaneously or partially simultaneously.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A radio frequency (RF) circuit, wherein the RF circuit comprises:
    an in-phase path, a quadrature-phase path, and a control circuit,
    the in-phase path comprises a first modulator and a first component,
    the quadrature-phase path comprises a second modulator and a second component,
    the first modulator, the second modulator, the first component, and the second component respectively comprise a first current digital-to-analog converter (IDAC), a second IDAC, a third IDAC, and a fourth IDAC, and
    the control circuit performs following steps to calibrate the RF circuit:
    (A) calibrating direct current (DC) offsets of the first modulator and the second modulator to obtain a first target setting value for the first IDAC and the second IDAC;
    (B) swapping the in-phase path and the quadrature-phase path, and then calibrating the DC offsets of the first modulator and the second modulator again to obtain a second target setting value for the first IDAC and the second IDAC;
    (C) setting the first IDAC and the second IDAC with a value of a function of the first target setting value and the second target setting value;
    (D) calibrating DC offsets of the first component and the second component to obtain a third target setting value for the third IDAC and the fourth IDAC;
    (E) calibrating the DC offsets of the first modulator and the second modulator to obtain a fourth target setting value for the first IDAC and the second IDAC; and
    (F) calibrating the DC offsets of the first component and the second component to obtain a fifth target setting value for the third IDAC and the fourth IDAC.

2. The RF circuit of claim 1, wherein the calibration in step (A) is performed according to a first calibration interval, the calibration in step (E) is performed according to a second calibration interval, and the second calibration interval is smaller than the first calibration interval.

3. The RF circuit of claim 2, wherein the calibration in step (D) is performed according to a third calibration interval, the calibration in step (F) is performed according to a fourth calibration interval, and the fourth calibration interval is smaller than the third calibration interval.

4. The RF circuit of claim 3, wherein the control circuit determines the fourth calibration interval according to the third target setting value.

5. The RF circuit of claim 2, wherein the control circuit determines the second calibration interval according to the value of the function.

6. The RF circuit of claim 1, wherein the calibration in step (D) is performed according to a first calibration interval, the calibration in step (F) is performed according to a second calibration interval, and the second calibration interval is smaller than the first calibration interval.

7. The RF circuit of claim 6, wherein the control circuit determines the second calibration interval according to the third target setting value.

8. The RF circuit of claim 1, wherein the first component is a first low-pass filter, and the second component is a second low-pass filter.

9. The RF circuit of claim 8, wherein step (A) and step (E) further comprise decreasing a gain of the first low-pass filter and a gain of the second low-pass filter, and step (D) and step (F) further comprise increasing the gain of the first low-pass filter and the gain of the second low-pass filter.

10. The RF circuit of claim 1, wherein the first component is a first buffer, and the second component is a second buffer.

11. A calibration method for a radio frequency (RF) circuit, wherein the RF circuit comprises an in-phase path and a quadrature-phase path,
the in-phase path comprises a first modulator and a first component,
the quadrature-phase path comprises a second modulator and a second component,
the first modulator, the second modulator, the first component, and the second component respectively comprise a first current digital-to-analog converter (IDAC), a second IDAC, a third IDAC, and a fourth IDAC,
the calibration method comprising:
(A) calibrating direct current (DC) offsets of the first modulator and the second modulator to obtain a first target setting value for the first IDAC and the second IDAC;
(B) swapping the in-phase path and the quadrature-phase path, and then calibrating the DC offsets of the first modulator and the second modulator again to obtain a second target setting value for the first IDAC and the second IDAC;
(C) setting the first IDAC and the second IDAC with a value of a function of the first target setting value and the second target setting value;
(D) calibrating DC offsets of the first component and the second component to obtain a third target setting value for the third IDAC and the fourth IDAC;
(E) calibrating the DC offsets of the first modulator and the second modulator to obtain a fourth target setting value for the first IDAC and the second IDAC; and
(F) calibrating the DC offsets of the first component and the second component to obtain a fifth target setting value for the third IDAC and the fourth IDAC.

12. The calibration method of claim 11, wherein the calibration in step (A) is performed according to a first calibration interval, the calibration in step (E) is performed according to a second calibration interval, and the second calibration interval is smaller than the first calibration interval.

13. The calibration method of claim 12, wherein the calibration in step (D) is performed according to a third calibration interval, the calibration in step (F) is performed according to a fourth calibration interval, and the fourth calibration interval is smaller than the third calibration interval.

14. The calibration method of claim 13, wherein the fourth calibration interval is determined according to the third target setting value.

15. The calibration method of claim 12, wherein the second calibration interval is determined according to the value of the function.

16. The calibration method of claim 11, wherein the calibration in step (D) is performed according to a first calibration interval, the calibration in step (F) is performed according to a second calibration interval, and the second calibration interval is smaller than the first calibration interval.

17. The calibration method of claim 16, wherein the second calibration interval is determined according to the third target setting value.

18. The calibration method of claim 11, wherein the first component is a first low-pass filter, and the second component is a second low-pass filter.

19. The calibration method of claim 18, wherein step (A) and step (E) further comprise decreasing a gain of the first low-pass filter and a gain of the second low-pass filter, and step (D) and step (F) further comprise increasing the gain of the first low-pass filter and the gain of the second low-pass filter.

20. The calibration method of claim 11, wherein the first component is a first buffer, and the second component is a second buffer.

* * * * *